(12) United States Patent
Kumagai et al.

(10) Patent No.: US 8,468,690 B2
(45) Date of Patent: Jun. 25, 2013

(54) HOLDING MEMBER FOR USE IN TEST AND METHOD FOR MANUFACTURING SAME

(75) Inventors: Yasunori Kumagai, Nirasaki (JP); Shigekazu Komatsu, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 471 days.

(21) Appl. No.: 12/744,780

(22) PCT Filed: Nov. 5, 2008

(86) PCT No.: PCT/JP2008/070105
§ 371 (c)(1),
(2), (4) Date: Oct. 21, 2010

(87) PCT Pub. No.: WO2009/069438
PCT Pub. Date: Jun. 4, 2009

(65) Prior Publication Data
US 2011/0025344 A1 Feb. 3, 2011

(30) Foreign Application Priority Data
Nov. 26, 2007 (JP) .................................. 2007-303950

(51) Int. Cl.
*H05K 3/30* (2006.01)
(52) U.S. Cl.
USPC ............ 29/832; 324/555; 324/158.1; 384/12; 428/18
(58) Field of Classification Search
USPC ............................................ 324/555; 29/892
See application file for complete search history.

(56) References Cited

U.S. PATENT DOCUMENTS

| | | | |
|---|---|---|---|
| 5,619,145 A | 4/1997 | Matsuda | |
| 6,390,677 B1 * | 5/2002 | Zywno | 384/12 |
| 6,597,432 B2 * | 7/2003 | Ida | 355/73 |
| 6,698,735 B2 * | 3/2004 | Zywno | 269/21 |
| 6,853,205 B1 * | 2/2005 | Cheng et al. | 324/755.05 |
| 7,745,943 B2 * | 6/2010 | Haba et al. | 257/786 |
| 2002/0054717 A1 * | 5/2002 | Zywno | 384/12 |
| 2002/0157246 A1 * | 10/2002 | Ogimoto | 29/832 |
| 2004/0161179 A1 * | 8/2004 | Zywno | 384/12 |
| 2007/0017442 A1 * | 1/2007 | Yamasaki et al. | 118/695 |
| 2007/0063453 A1 * | 3/2007 | Ishikawa et al. | 279/3 |
| 2007/0084825 A1 * | 4/2007 | Yashima | 216/41 |
| 2007/0124928 A1 * | 6/2007 | Takano | 29/832 |
| 2007/0222131 A1 * | 9/2007 | Fukumoto et al. | 269/21 |
| 2012/0013348 A1 * | 1/2012 | Chen et al. | 324/555 |

FOREIGN PATENT DOCUMENTS

| | | | |
|---|---|---|---|
| JP | 61 252642 | | 11/1986 |
| JP | 06457633 A | * | 3/1989 |
| JP | 7 98361 | | 4/1995 |
| JP | 2002 202346 | | 7/2002 |

* cited by examiner

*Primary Examiner* — Melissa Koval
*Assistant Examiner* — Benjamin M Baldridge
(74) *Attorney, Agent, or Firm* — Oblon, Spivak, McClelland, Maier & Neustadt, L.L.P.

(57) ABSTRACT

A holding member for use in a test includes a base made of silicon or glass and chips in which devices are formed is mountable thereon. Positioning members made of resist sheets are formed on the top surface of the base. A resist film is formed on the bottom surface of the base, and suction grooves (intersection portions, connection portions) and support members are formed in the resist film. Suction holes are formed in regions of the top surface of the base where the chips are mounted, wherein the suction holes are formed through the base and communicate with the suction groove.

11 Claims, 5 Drawing Sheets

HOLDING MEMBER FOR USE IN TEST AND METHOD FOR MANUFACTURING SAME

FIELD OF THE INVENTION

The present invention relates to a holding member for use in an electrical characteristics test of a device and a method for manufacturing the holding member.

BACKGROUND OF THE INVENTION

An electrical characteristics test of a device, e.g., an IC chip or the like, is carried out by using, e.g., a probe apparatus. The probe apparatus includes a probe card having a circuit substrate and a contactor support substrate for supporting a plurality of probe pins; a holding member installed to oppositely face the probe pins, for holding chips in which devices are formed; and a mounting table for adsorptively holding the holding member. Further, electrical characteristics of the devices are tested by bringing the probe pins into contact with electrodes of the devices and then applying electrical signals for the test from the probe pins to the electrodes.

In order to test the electrical characteristics of the devices properly, the chips need to be held at predetermined positions on the holding member. Therefore, it is suggested to use a chip holding member made of, e.g., ceramic that can be easily machined. It is further suggested that the holding member has accommodating portions for accommodating chips on a top surface of the holding member and suction holes for adsorptively holding the chips on a bottom surface of the accommodating portions. The suction holes are formed through the holding member and communicate with air suction paths (suction grooves) formed on a bottom surface of the holding member. Moreover, the holding member and the chips are sucked to be held on the mounting table by suction (Patent Document 1).

Patent Document: Japanese Patent Application Publication No. H7-98361

While the holding member made of ceramic as described above can be easily manufactured, flatness of the holding member decreases and it cannot be made thin. Further, a manufacturing cost of the holding member increases.

Hence, the present inventors have attempted to use a holding member made of silicon or glass. The holding member made of silicon or glass is advantageous in that silicon or glass has higher flatness than that of ceramic, and it can be manufactured with a thin thickness and at a low cost while maintaining proper stiffness. Moreover, silicon has thermal conductivity higher than that of ceramic.

However, when the holding member is made of either silicon or glass, it is difficult to mechanically form a suction groove or the like having a complicated shape on the bottom surface of the holding member. Especially, when a thin holding member is directly machined, strength of the holding member becomes weak such that required stiffness cannot be maintained, thereby making it difficult to form the holding member in such complicated shape.

SUMMARY OF THE INVENTION

In view of the above, it is an object of the present invention to form suction grooves or the like having a complicated shape on a holding member for use in a test which is made of silicon or glass and used for an electrical characteristics test of a device.

In order to achieve the object of the present invention, there is a holding member for use in a test which holds one or more devices when electrical characteristics of the devices are tested, including: a base which is made of silicon or glass and allows a plurality of chips in which the devices are formed to be mounted at predetermined positions thereof; and a resist film formed on a bottom surface of the base, wherein a plurality of suction holes for sucking and holding the chips mounted on the base is formed through the base; and suction grooves communicating with the suction holes are formed in the resist film.

In accordance with the present invention, the resist film is formed on the bottom surface of the base, so that the suction grooves having a complicated shape can be easily and properly formed on the resist film. To be specific, the suction grooves can be formed in a predetermined shape on the bottom surface of the base by patterning the resist film by, e.g., photolithography. Thus, the base need not be processed directly, and hence can be made of silicon or glass.

EFFECTS OF THE INVENTION

In accordance with the present invention, suction grooves having a complicated shape can be easily formed on a resist film formed on a bottom surface of a base, and the base can be made of silicon or glass.

BRIEF DESCRIPTION OF THE DRAWINGS

FIGS. 5A to 5C explain a manufacturing process of the holding member, wherein FIG. 5A illustrates a state where suction holes are formed in the base; FIG. 5B depicts a state where resist sheets are laminated on the top and the bottom surface of the base; and FIG. 5C shows a state where positioning members are formed on the top surface of the base and suction grooves and support members are formed on the bottom surface of the base.

DETAILED DESCRIPTION OF THE EMBODIMENT

Figure 1:
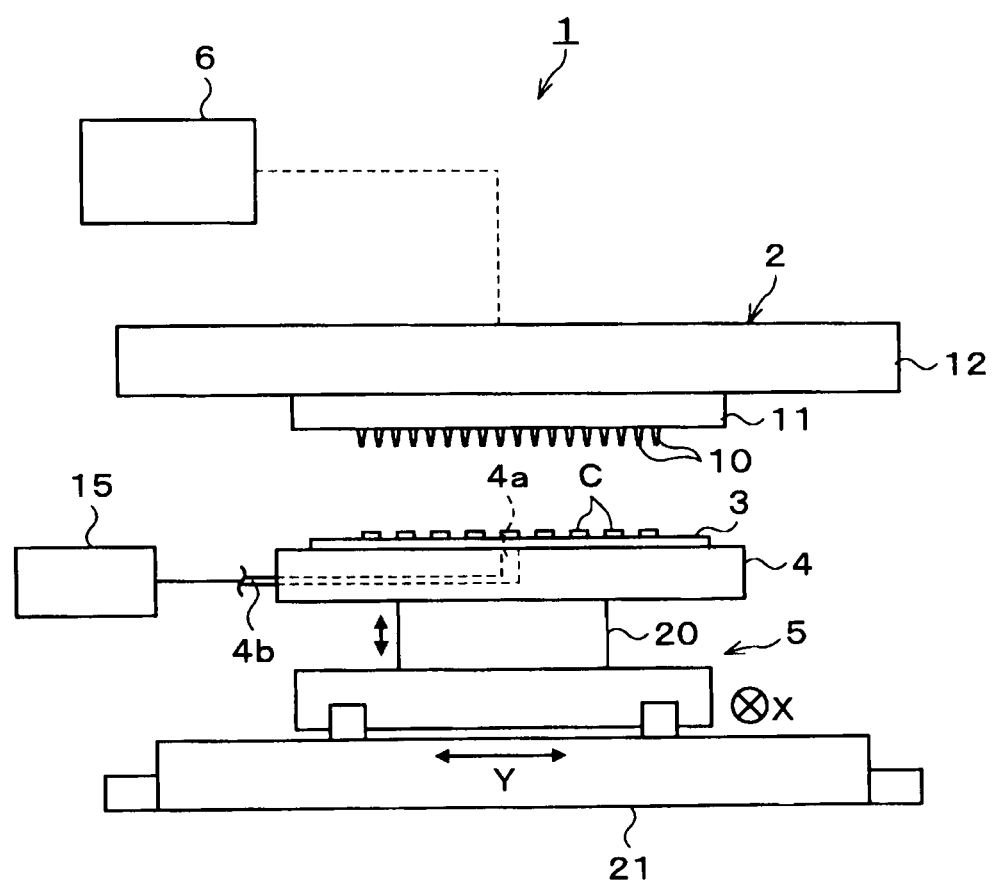
FIG. 1 is a plan view showing a schematic configuration of a probe apparatus on which a holding member for use in a test in accordance with an embodiment of the present invention is mounted.

Hereinafter, an embodiment of the present invention will be described. FIG. 1 schematically shows a configuration of a probe apparatus 1 including a holding member for test in accordance with the embodiment of the present invention.

As shown in FIG. 1, the probe apparatus 1 includes, for example, a probe card 2, a holding member 3 for use in a test for holding chips C in which devices are formed, a chuck 4 for adsorptively holding the holding member 3, a moving mechanism 5 for moving the chuck 4, a tester 6 and the like.

The probe card 2 has a contactor support substrate 11 for supporting a plurality of probe pins 10 on its bottom surface, and a circuit substrate 12 attached to a top surface of the contactor support substrate 11. The probe pins 10 are electrically connected to the circuit substrate 12 through a main body of the contactor support substrate 11. The tester 6 is electrically connected to the probe card 2, and electrical signals for electrical characteristics test are transmitted and received between the tester 6 and the probe pins 10 through the circuit substrate 12.

The chuck 4 is formed in an approximately disc shape having a flat top surface. A suction port 4a for sucking and holding the holding member 3 is formed in a top surface of the chuck 4. The suction port 4a is connected to a suction pipe 4b which passes through inner side of the chuck 4 and communicates with an external negative pressure generator 15.

The moving mechanism 5 has an elevation drive unit 20, e.g., a cylinder device for vertically moving the chuck 4, and an X-Y stage 21 for moving the elevation drive unit 20 in two horizontal orthogonal X and Y directions. Therefore, the holding member 3 held on the chuck 4 can be moved three dimensionally, and a certain probe pin 10 provided thereabove can be brought into contact to a predetermined position on a surface of the holding member 3.

Figure 2:
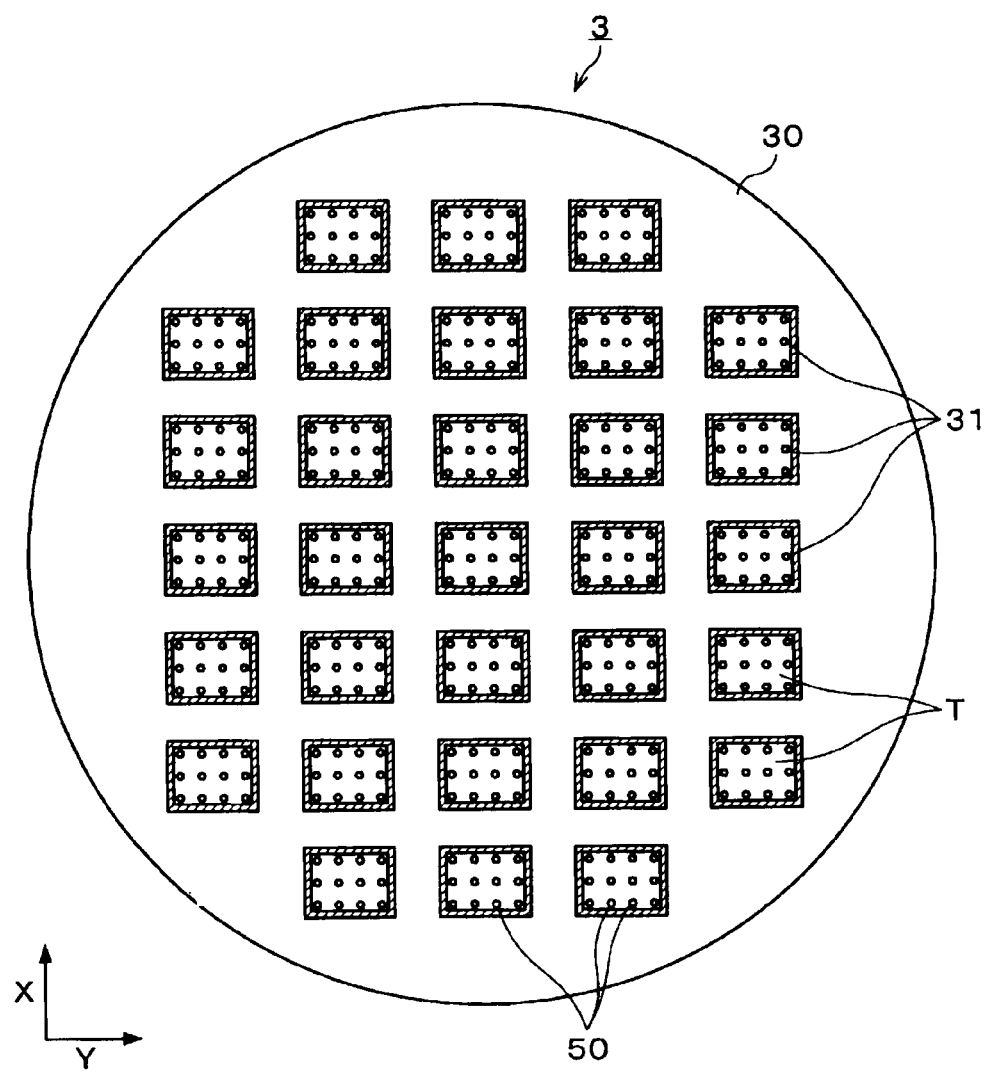
FIG. 2 describes a top view of a top surface of the holding member.

As illustrated in FIG. 2, the holding member 3 held on the chuck 4 has a disc-shaped base 30. The base 30 is made of, e.g., silicon or glass.

Figure 3:
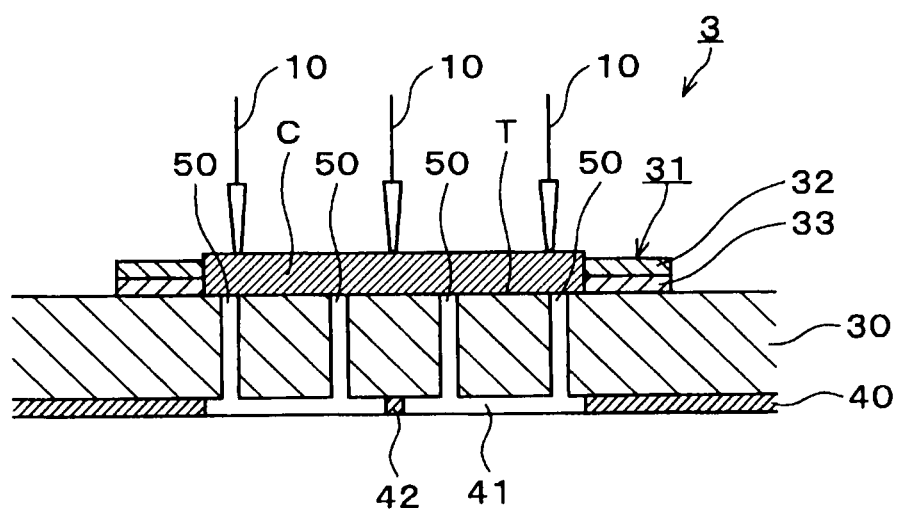
FIG. 3 provides a vertical cross sectional view of the holding member.

A plurality of positioning members 31 for positioning the chips C is arranged on the top surface of the base 30 along, e.g., an X direction and a Y direction in a horizontal plane of the top surface of the base 30 that are orthogonal to each other. Each of the positioning members 31 is formed to surround a region T where a chip C is mounted, and the chip C is positioned by the positioning member 31 being in contact with side surfaces of the chip C as illustrated in FIG. 3. Each of the positioning members 31 is formed by laminating, e.g., two resist sheets 32 and 33.

Figure 4:
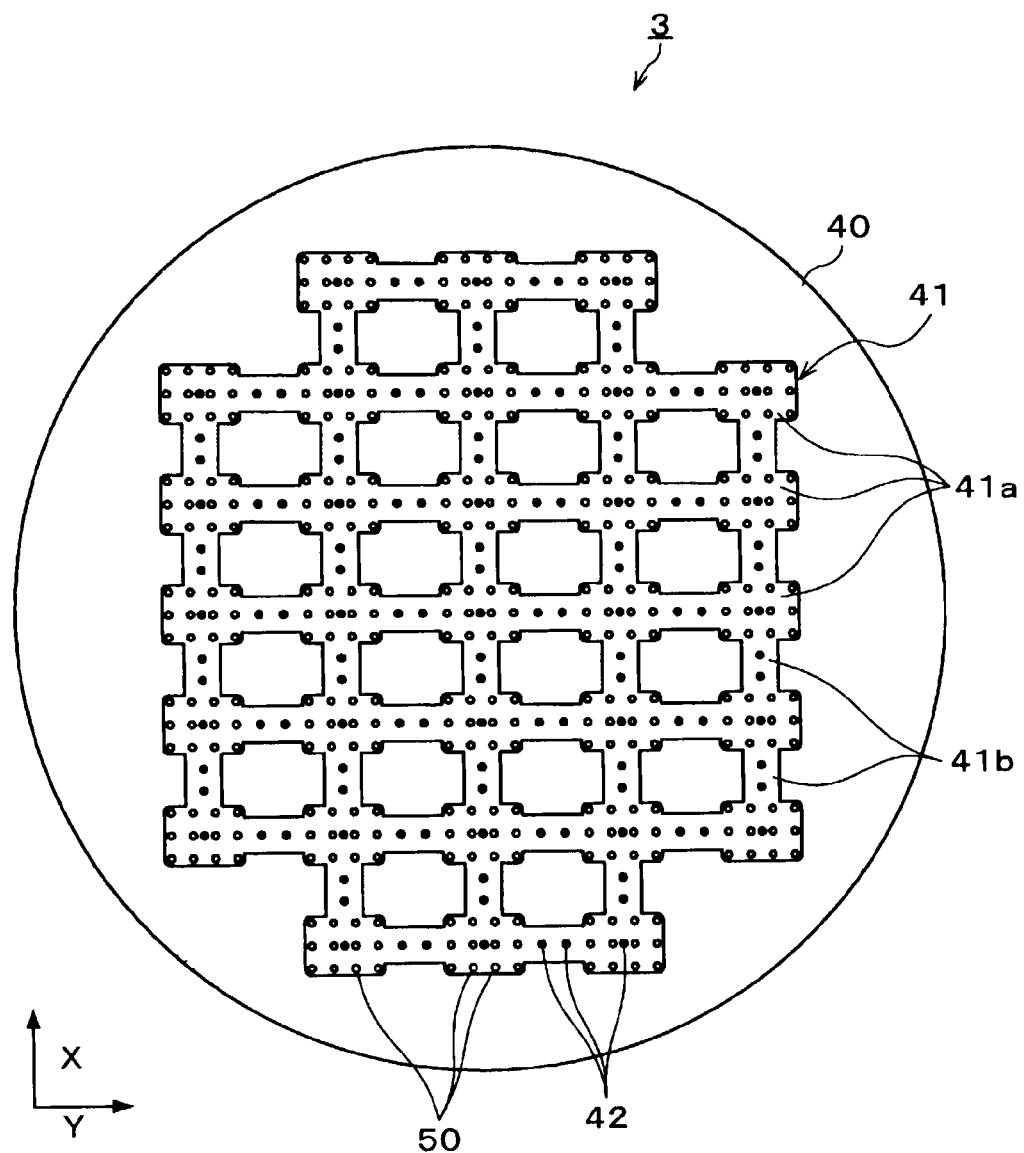
FIG. 4 presents a bottom view of a bottom surface of the holding member.

As can be seen from FIG. 4, a resist film 40 is formed on a bottom surface of the base 30. The resist film 40 is formed by laminating, e.g., a resist sheet on the bottom surface of the base 30. Suction grooves 41 are formed on the resist film 40 while intersecting one another in the X and Y directions. Intersection portions 41a where the suction grooves 41 intersect one another are formed at locations corresponding to the regions T of the base 30 where the chips C are mounted. Further, connection portions 41b connect the intersection portions 41a in the X and Y directions. Due to the formation of the suction grooves 41, the resist film 40 is divided into a plurality of regions. The suction grooves 41 communicate with the suction port 4a of the chuck 4 where the resist film 40 comes into contact.

Moreover, the resist film 40 is partially left in the intersection portions 41a and the connection portions 41b of the suction grooves 41 to form a plurality of support members 42. For example, one support member 42 is formed at the center of each intersection portion 41a, and two support members 42 are formed along a central line in a length direction of each connection portion 41b. As shown in FIG. 3, the supporting member 42 can support a load caused by applying a probe pressure from the probe pins 10 to the chip C or a load caused by a weight of the base 30, and also can suppress bending of the chip C or the base 30 that may occur due to the intersection portions 41a or the connection portions 41b that are opened.

As can be seen from FIG. 2, a plurality of suction holes 50 are formed along the X and Y directions in the regions T on the top surface of the base 30 where the chips C are mounted. As illustrated in FIG. 3, the suction holes 50 are formed through the base 30 and communicate with the suction grooves 41 on the bottom surface of the base 30. The suction holes 50 are formed at positions that are not interfered with the support members 42 in the intersection portions 41a of the suction grooves 41. Further, when the holding member 3 is mounted on the chuck 4, the suction holes 50, the suction grooves 41 and the suction port 4a of the chuck 4 communicate with one another. Therefore, the holding member 3 is sucked by suction through the suction port 4a of the chuck 4 and the chips C can be adsorbed onto the top surface of the holding member 3.

The probe apparatus 1 having the holding member 3 in accordance with the embodiment of the present invention is configured as described above.

Hereinafter, a method for manufacturing the holding member 3 and a method for an electrical characteristics test of a device that is performed by the probe apparatus 1 having the holding member 3 will be explained.

Figure 5A:
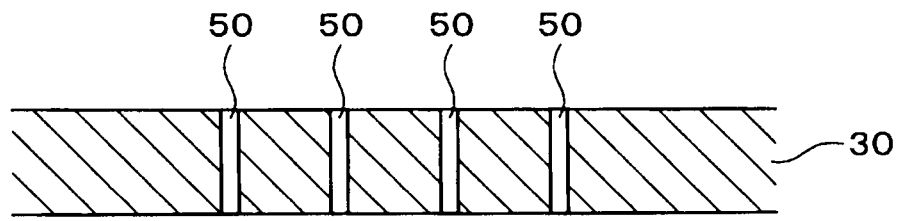

First, the method for manufacturing the holding member 3 will be described. Alignment marks indicating positions of the suction holes 50 to be made are arranged on the top surface of the base 30. Based on the alignment marks, the suction holes 50 are formed through the base 30 at the respective alignment marks, as depicted in FIG. 5A. Moreover, the alignment marks may be arranged on the bottom surface of the base 30.

Figure 5B:
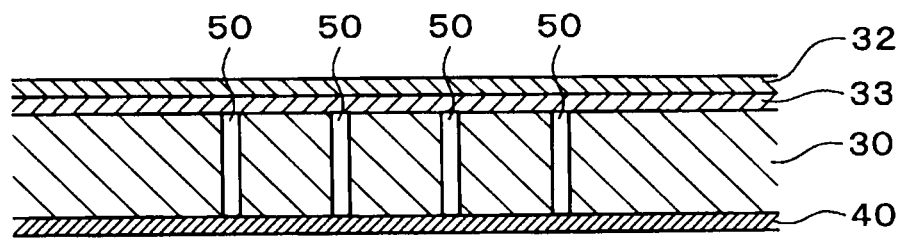

After the suction holes 50 are formed in the base 30, the resist sheets 32 and 33 are laminated on the top surface of the base 30 as shown in FIG. 5B and, then, the patterns of the positioning members 31 are exposed. Further, the resist film 40 is formed by laminating resist sheets on the bottom surface of the base 30, and the patterns of the suction grooves 41 (the intersection portions 41a and the connection portions 41b) and the support members 42 are exposed.

Figure 5C:
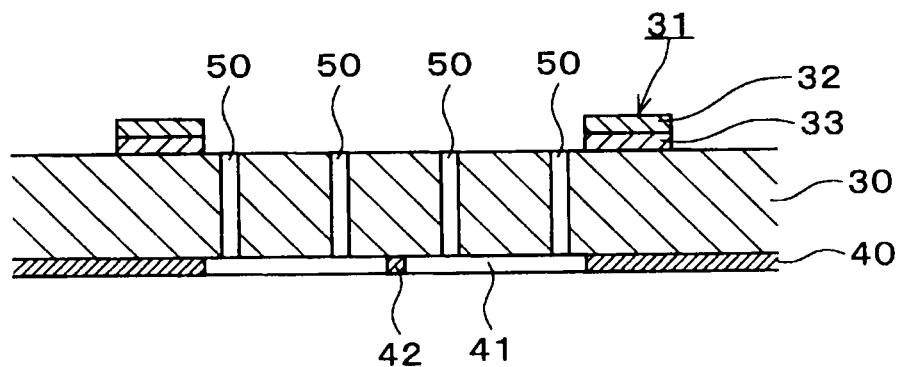

After the top and the bottom surface of the base 30 are exposed, the exposed portions of the top and the bottom surface of the base 30 are developed as illustrated in FIG. 5C. The top and the bottom surface of the base 30 may be developed at the same time. In this manner, the holding member 3 is manufactured.

Hereinafter, the method for the electrical characteristics test of the device on a chip C that is performed by the probe apparatus 1 having the holding member 3 will be explained.

First, a plurality of chips C is mounted on the respective regions T of the holding member 3, as shown in FIG. 3. At this time, the chips C are positioned by the respective positioning members 31. Next, the holding member 3 is adsorptively held on the chuck 4, as shown in FIG. 1. At this time, the chips C are sucked through the suction holes 50 and fixed by suction force to the chuck 4. Then, the chuck 4 is moved horizontally by the moving mechanism 5 to adjust the positions of the chips in the X and Y directions. Thereafter, the chuck 4 is raised. In this manner, the probe pins 10 are brought into contact with the devices on the chips C, as illustrated in FIG. 3.

Further, for example, a withstanding voltage of a device is tested by the tester 6 in a state where a high voltage is applied, e.g., between the probe pins 10, and a current flows between the probe pins 10 and the device. At this time, the voltage applied between the probe pins 10 is measured by, e.g., a monitor (not shown) installed in the tester 6, and further, a voltage actually applied to the device during the test is measured. By measuring the actual voltage applied to the device, it is possible to apply an accurate load to the device by taking the electrical loss caused by contact resistance or the like into consideration. In this manner, electrical characteristics of the device are tested by employing a four-terminal Kelvin measurement method.

Upon completion of the electrical characteristics test, the chuck 4 is lowered by the driving mechanism 5, and the probe pins 10 are moved away from the chips C. Next, the holding member 3 is separated from the chuck 4, and a series of test processes is completed.

In accordance with the above-described embodiment, after the resist film 40 is formed on the bottom surface of the base 30 of the holding member 3, the resist film 40 is exposed and developed. Therefore, the suction grooves 41 having a complicated shape can be easily formed on the resist film 40. Accordingly, the base 30 need not be machined directly, and hence can be made of silicon or glass.

Since the base 30 can be made of silicon or glass, the flatness of the base 30 can be increased compared to the case where the base is made of ceramic. Moreover, the base 30 of a thin thickness can be manufactured while maintaining proper stiffness. Besides, a manufacturing cost of the base 30 can be reduced. Furthermore, when the base 30 is made of silicon, thermal conductivity is improved compared to the conventional case where the base 30 is made of ceramic.

The suction grooves 41 are formed in the resist film 40 on the bottom surface of the base 30 to intersect one another, so that the resist film 40 is divided into a plurality of regions. This makes it possible to reduce stress applied to the resist film 40 due to a thermal expansion difference between the base 30 and the resist film 40. Accordingly, even if an atmospheric temperature changes during the test of the devices on the chips C, electrical characteristics of the devices can be properly tested by using the holding member 3 of the present invention.

The support members 42 formed at the intersection portions 41a and the connection portions 41b of the suction grooves 41 of the base 30 can support a load caused by applying a probe pressure from the probe pins C to the chip C or a load caused by a weight of the base 30. Hence, it is possible to suppress bending of the chip C or the base 30 that may occur due to the intersection portions 41a or the connection portions 41b that are opened.

The resist film 40 formed on the bottom surface of the base 30 is more flexible than silicon or glass forming the base 30, so that the holding member 3 can be closely adhered to the chuck 4.

After the resist sheets 32 and 33 are laminated on the top surface of the base 30, the resist sheets 32 and 33 are exposed and developed. Thus, the positioning members 31 can be easily formed at predetermined positions. As a consequence, the chips C can be mounted on predetermined positions of the base 30 with high accuracy.

The suction holes 50 communicating with the suction grooves 41 on the bottom surface of the base 30 are formed in the regions T on the top surface of the base 30 where the chips C are mounted. Accordingly, the chips C are sucked through the suction port 4a to thereby be stably held on the base 30.

Since the resist sheets are laminated on the top and the bottom surface of the base 30, uniformity of a film thickness is improved and flatness of the top and the bottom surface of the holding member 3 can be better maintained compared to a case where a resist film is coated.

Although the base 30 is made of silicon or glass in the above-described embodiment, the base 30 may be made of a silicon oxide. In that case as well, the flatness of the base 30 can be increased compared to the conventional case where the base is made of ceramic. Besides, the base 30 of a thin thickness can be manufactured while maintaining proper stiffness, and a manufacturing cost of the base 30 can be reduced.

Instead of laminating the resist sheets on the top and the bottom surface of the base 30, it is also possible to use a material, e.g., photosensitive polyimide or heat resistant resin, which is more flexible than silicon or glass forming the base 30.

While the invention has been shown and described with respect to the embodiments, it will be understood by those skilled in the art that various changes and modification may be made without departing from the scope of the invention as defined in the following claims.

Industrial Applicability

The present invention is effective in stably carrying out required test with high accuracy when testing electrical characteristics of a device while holding the device at a proper position.

What is claimed is:

1. A holding member for use in a test which holds one or more devices when electrical characteristics of the devices are tested, comprising:
    a base which is made of silicon or glass and allows a plurality of chips in which the devices are formed to be mounted at predetermined positions thereof; and
    a resist film formed on a bottom surface of the base,
    wherein a plurality of suction holes for sucking and holding the chips mounted on the base is formed though the base; and suction grooves communicating with the suction holes are formed in the resist film.

2. The holding member of claim 1, wherein the resist film is divided into a plurality of regions by the suction grooves.

3. The holding member of claim 1, wherein the resist film is partially left in the suction grooves corresponding to regions of the base where the chips are mounted.

4. The holding member of claim 1, wherein the resist film is partially left in the suction grooves corresponding to regions other than regions of the base where the chips are mounted.

5. The holding member of claim 1, wherein the suction holes are arranged in two orthogonal directions in a horizontal plane of the base, and the suction grooves intersect one another.

6. The holding member of claim 1, wherein the resist film is formed of a resist sheet.

7. The holding member of claim 1, wherein positioning members, which are made of a resist and position the chips, are formed on a top surface of the base.

8. The holding member of claim 7, wherein the positioning members are formed of one or more resist sheets.

9. A method for manufacturing a holding member for use in a test which holds one or more devices when electrical characteristics of the devices are tested, comprising:
    forming suction holes, for sucking and holding a plurality of chips in which the devices are formed, through a top or a bottom surface of a base, the base being made of silicon or glass and allowing the chips to be mounted at predetermined positions thereof;
    laminating a resist sheet on the bottom surface of the base and exposing a pattern of suction grooves communicating with the suction holes on the resist sheet; and
    developing the bottom surface of the base.

10. The method of claim 9, further comprising:
    laminating one or more resist sheets on the top surface of the base and exposing a pattern of positioning members for positioning the chips on the resist sheets; and
    developing the top surface of the base.

11. The method of claim 10, wherein the top and the bottom surface of the base are developed at the same time.

* * * * *